United States Patent
Lee

(10) Patent No.: US 11,871,026 B2
(45) Date of Patent: Jan. 9, 2024

(54) DECODING DEVICE AND OPERATING METHOD THEREOF

(71) Applicant: SAMSUNG ELECTRONICS CO., LTD., Suwon-si (KR)

(72) Inventor: Miyeon Lee, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 40 days.

(21) Appl. No.: 17/854,147

(22) Filed: Jun. 30, 2022

(65) Prior Publication Data

US 2023/0038265 A1  Feb. 9, 2023

(30) Foreign Application Priority Data

Aug. 6, 2021 (KR) .................. 10-2021-0104210

(51) Int. Cl.
*H04N 19/513* (2014.01)
*G06T 7/20* (2017.01)
*H03M 13/29* (2006.01)
*H03M 13/11* (2006.01)
*H03M 13/25* (2006.01)

(52) U.S. Cl.
CPC ............ *H04N 19/513* (2014.11); *G06T 7/20* (2013.01); *H04N 19/521* (2014.11); *H03M 13/1108* (2013.01); *H03M 13/1168* (2013.01); *H03M 13/251* (2013.01); *H03M 13/2948* (2013.01)

(58) Field of Classification Search
CPC ....... H04N 19/513; H04N 19/521; G06T 7/20
See application file for complete search history.

(56) References Cited

U.S. PATENT DOCUMENTS

| | | | |
|---|---|---|---|
| 8,189,678 B2* | 5/2012 | Valmiki | H04N 19/42 348/715 |
| 8,681,164 B2 | 3/2014 | Owen et al. | |
| 9,015,551 B2 | 4/2015 | Wu et al. | |
| 9,083,976 B2 | 7/2015 | Xin et al. | |
| 9,305,616 B2 | 4/2016 | Yu et al. | |
| 9,363,523 B2 | 6/2016 | Chen | |
| 9,930,368 B2 | 3/2018 | Schierl et al. | |
| 10,075,722 B1 | 9/2018 | Cheng et al. | |
| 10,224,239 B2 | 3/2019 | Horowitz | |
| 10,244,239 B2 | 3/2019 | Horowitz | |
| 2015/0103879 A1* | 4/2015 | Sasai | H04N 19/13 375/240.01 |

(Continued)

*Primary Examiner* — Joseph D Torres
(74) *Attorney, Agent, or Firm* — F. Chau & Associates, LLC

(57) ABSTRACT

A decoding device includes a controller classifying a bitstream as a first bitstream and a second bitstream based on a plurality of blocks defined by a matrix and included in a frame, a first decoder including a first processor performing decoding on the first bitstream and outputting first decoding data and a first memory, a second decoder including a second processor performing decoding on the second bitstream and outputting second decoding data and a second memory, a first buffer transmitting the first decoding data to the second memory, and a second buffer transmitting the second decoding data to the first memory. The first processor controls the second memory to store the first decoding data, and the second processor controls the first memory to store the second decoding data.

19 Claims, 8 Drawing Sheets

(56) References Cited

U.S. PATENT DOCUMENTS

| | | | |
|---|---|---|---|
| 2016/0156937 A1* | 6/2016 | Yang | H04N 19/176 375/240.16 |
| 2016/0191935 A1 | 6/2016 | Chao et al. | |
| 2016/0337660 A1* | 11/2016 | Sugio | H04N 19/105 |
| 2017/0026648 A1 | 1/2017 | Wu et al. | |
| 2022/0014765 A1* | 1/2022 | Wan | H04N 19/14 |

* cited by examiner

DECODING DEVICE AND OPERATING METHOD THEREOF

CROSS-REFERENCE TO RELATED APPLICATION

This application claims priority under 35 U.S.C. § 119 to Korean Patent Application No. 10-2021-0104210, filed on Aug. 6, 2021 in the Korean Intellectual Property Office, the disclosure of which is incorporated by reference herein in its entirety.

TECHNICAL FIELD

Embodiments of the inventive concept relate to an electronic device, and more particularly, to a decoding device and an operating method thereof.

DISCUSSION OF RELATED ART

A video compression scheme of reducing a data size of a video is used to effectively transmit and receive a digital video. A compressed video stream may be decoded by a decoding device. When a multi-core decoder that decodes one stream by linking a plurality of single-core decoding devices is used, a decoding speed of a video stream that becomes increasingly high-definition may be increased.

SUMMARY

Embodiments of the inventive concept provide a decoding device and an operating method thereof. The decoding device may be configured to perform decoding even when a video is encoded according to a certain codec, and reduce the occurrence of data path congestion due to a path length-ened by data sharing between multi-cores when a system on chip (SoC) is implemented.

A decoding device according to an embodiment of the inventive concept includes a controller configured to receive a bitstream, classify the bitstream as a first bitstream and a second bitstream based on a plurality of blocks defined by a matrix and included in a frame, and output the first bitstream and the second bitstream. The decoding device further includes a first decoder including a first processor configured to perform decoding on the first bitstream and output first decoding data, and a first memory configured to store second decoding data obtained by decoding the second bitstream. The decoding device further includes a second decoder including a second processor configured to perform decoding on the second bitstream and output the second decoding data, and a second memory configured to store the first decoding data. The decoding device further includes a first buffer configured to transmit, to the second memory, the first decoding data output by the first processor, and a second buffer configured to transmit, to the first memory, the second decoding data output by the second processor. The first processor is configured to control the second memory to store the first decoding data, and the second processor is configured to control the first memory to store the second decoding data.

A decoding device according to an embodiment of the inventive concept includes a controller configured to receive a bitstream, and classify the bitstream as a classified bitstream corresponding to blocks included in an identical row among a plurality of blocks defined by a matrix and included in a frame, N decoders (N is a natural number greater than or equal to 3) each including a processor configured to perform decoding on the classified bitstream by receiving the classified bitstream and output decoding data, and a memory storing the decoding data, and N buffers each configured to transmit, to the memory, the decoding data output by the processor, and respectively corresponding to the N decoders. A k−1th processor included in a k−1th decoder (k is an integer from 2 to N) is configured to control a kth memory to store k−1th decoding data output from the k−1th decoder in the kth memory included in a kth decoder, and a k−1th buffer corresponding to the k−1th decoder is configured to transmit the k−1th decoding data to the kth memory.

A decoding method according to an embodiment of the inventive concept includes receiving a bitstream classified based on a plurality of blocks defined by a matrix and included in a frame, determining whether reference data obtained by decoding a first portion of the bitstream corresponding to a reference block included in a first column identical to a second column including a block currently being decoded is stored in a first memory, performing decoding on a second portion of the bitstream corresponding to the block currently being decoded and outputting decoding data based on the reference data and whether the reference data is stored in the first memory, storing the decoding data in a buffer corresponding to the first memory, and controlling a second memory, which is different from the first memory, to store the decoding data.

BRIEF DESCRIPTION OF THE DRAWINGS

The above and other features of the inventive concept will become more apparent by describing in detail embodiments thereof with reference to the accompanying drawings, in which.

DETAILED DESCRIPTION OF THE EMBODIMENTS

Figure 1:
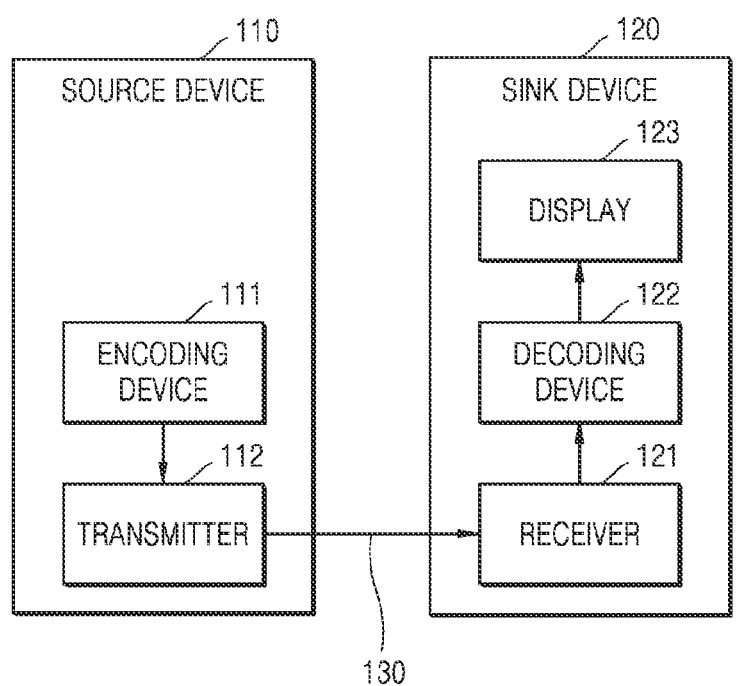
FIG. 1 is a diagram illustrating a video system according to an embodiment.

Embodiments of the present inventive concept will be described more fully hereinafter with reference to the accompanying drawings Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

FIG. 1 is a diagram illustrating a video system according to an embodiment.

Referring to FIG. 1, a video system 100 may include a source device 110 and a sink device 120. According to an embodiment, the video system 100 may further include other general-purpose components in addition to the components shown in FIG. 1.

The source device 110 may include an encoding device 111 and a transmitter 112. The source device 110 may be an electronic device that generates video data by itself or receives video data. The source device 110 may be implemented in various forms such as, for example, an optical media player such as a digital video disc (DVD) or BLU-RAY player, an ultra-high definition (UHD) player, a set-top box, a television (TV), a computer, a mobile device, a home theater, a game device, a content server, etc.

The encoding device 111 may receive video data. For example, the encoding device 111 may receive video data from a video capture device such as a video camera and a video archive including a pre-captured video.

Video data may be a series of video frames. Video blocks may have fixed or variable sizes and may vary in size according to a specified encoding standard. Each of the video blocks, which is often referred to as a macro block (MB), may be arranged into sub-blocks. Macro blocks and various sub-blocks are video blocks.

The encoding device 111 may encode video data. The encoded video data may be output as a bitstream. Frames of the encoded video data may be output as a bitstream. According to intra- or inter-based prediction of video blocks, the encoding device 111 may perform quantization operations and entropy coding operations to encode video data. The encoding device 111 may operate according to a video compression scheme such as, for example, advanced video coding (AVC), VP8, VP9, high efficiency video coding (HEVC), or AOMedia Video 1 (AV1).

The transmitter 112 may transmit, to a receiver 121 of the sink device 120, the bitstream output from the encoding device 111 in the form of a file or streaming. For example, the transmitter 112 may transmit the bitstream to the receiver 121 as a file that may be downloaded at the receiver 121 and subsequently utilized, or may stream data to the receiver 121. For example, the transmitter 112 may transmit, to the receiver 121, the bitstream output from the encoding device 111, through a communication channel 130.

The communication channel 130 may transmit, to the receiver 121, a video stream encoded through the source device 110.

The communication channel 130 may include a wireless or wired communication medium such as a radio frequency (RF) spectrum or one or more physical transmission lines or any combination of wireless and wired media. The communication channel 130 may form part of a packet-based network, such as, for example, a local area network, a wide area network, or a global network such as the Internet. The communication channel 130 generally represents any suitable communication medium or collection of different communication media for transmitting the encoded video data from the source device 110 to the receiver 121.

The sink device 120 may include the receiver 121, a decoding device 122, and a display 123. The sink device 120 may be an electronic device that processes and reproduces video data (for example, encoded video data) transmitted from the source device 110. Here, the term "reproduces" may mean displaying of an image according to processed video data, outputting of audio according to processed audio data, or displaying of an image and audio according to processed video data and audio data. The sink device 120 may be implemented in various forms such as, for example, a TV, a monitor, a portable multimedia player, a mobile phone, a tablet personal computer (PC), an electronic picture frame, an electronic bulletin board, and an electronic billboard. Although FIG. 1 shows that the encoding device 111 is included in the source device 110 and the decoding device 122 is included in the sink device 120, embodiments of the inventive concept are not limited thereto. For example, according to embodiments, the encoding device 111 and the decoding device 122 may be included in the source device 110 and/or the sink device 120.

The receiver 121 may receive, from the source device 110, a bitstream obtained by encoding video data, through the communication channel 130.

The transmitter 112, the communication channel 130, and the receiver 121 may be configured for communication according to a wireless or wired communication system including one or more of, for example, Ethernet, telephone, cable, power-line, and optical fiber systems, and/or a wireless system including other schemes for data communication between one or more of, for example, code-division multiple access (CDMA or CDMA2000) communication systems, frequency-division multiple access (FDMA) systems, orthogonal frequency-division multiplexing (OFDM) access systems, time-division multiple access (TDMA) such as global system for mobile communications (GSM), general packet radio service (GPRS) or enhanced data GSM environment (EDGE), terrestrial trunked radio (TETRA) mobile telephone systems, wideband code division multiple access (WCDMA) systems, high data rate first generation evolution data-only (1×EV-DO) or 1×EV-DO gold multicast systems, IEEE 802.18 systems, mediaFLO™ systems, DMB systems, or DVB-H systems, or two or more devices.

The decoding device 122 may receive a bitstream from the source device 110 and decode the bitstream. The decoding device 122 may receive the bitstream and classify the bitstream. For example, the decoding device 122 may classify the bitstream as a bitstream corresponding to blocks included in the same row among a plurality of blocks defined by a matrix and included in a frame.

The decoding device 122 may perform decoding on the classified bitstream and output decoding data. The decoding device 122 may store the output decoding data. For example, the decoding device 122 may include a first decoder performing decoding on a first bitstream and a second decoder performing decoding on a second bitstream, in which the first decoder may include a first memory storing second decoding data obtained by performing decoding on the second bitstream, and the second decoder may include a second memory storing first decoding data obtained by performing decoding on the first bitstream.

The decoding device 122 may classify the bitstream and share a memory storing the decoding data obtained by performing decoding on the classified bitstream. The decoding device 122 may decode the bitstream and output decoded pixel data. The decoding device 122 is described in detail with reference to FIG. 2.

The decoding device 122 may operate according to a video compression scheme such as, for example, AVC, VP8, VP9, HEVC, or AV1. For example, the decoding device 122 may receive video data encoded according to AV1 and decode the encoded video data, and the decoding device 122 may receive video data encoded according to HEVC and decode the encoded video data.

The sink device 120 may display decoded pixel data to a user on the display 123. For example, pixel data decoded by the decoding device 122 may be stored in a storage, and the display 123 may reconfigure the stored pixel data and display the stored pixel data to the user. The display 123 may include various display devices such as, for example, a cathode-ray tube (CRT) display device, a liquid crystal display (LCD), a plasma display, a light-emitting diode (LED) display, an organic LED (OLED) display, or other types of display units.

Each of the encoding device 111 and the decoding device 122 may be implemented as, for example, one or more microprocessors, digital signal processors (DSPs), application-specific integrated circuits (ASICs), field-programmable gate arrays (FPGAs), distributed logic, software, hardware, firmware, or any combination thereof. Each of the encoding device 111 and the decoding device 122 may be included in one or more encoders or decoders integrated as part of a combined encoder/decoder (CODEC) of each mobile device, subscriber device, broadcasting device, etc.

Each of the source device 110 and the sink device 120 may include appropriate modulation, demodulation, frequency transformation, filtering, and amplifier components for transmitting and receiving encoded video, each including RF wireless components and antennas to support wireless communication. For example, components may be used as the transmitter 112 and the receiver 121.

Figure 2:
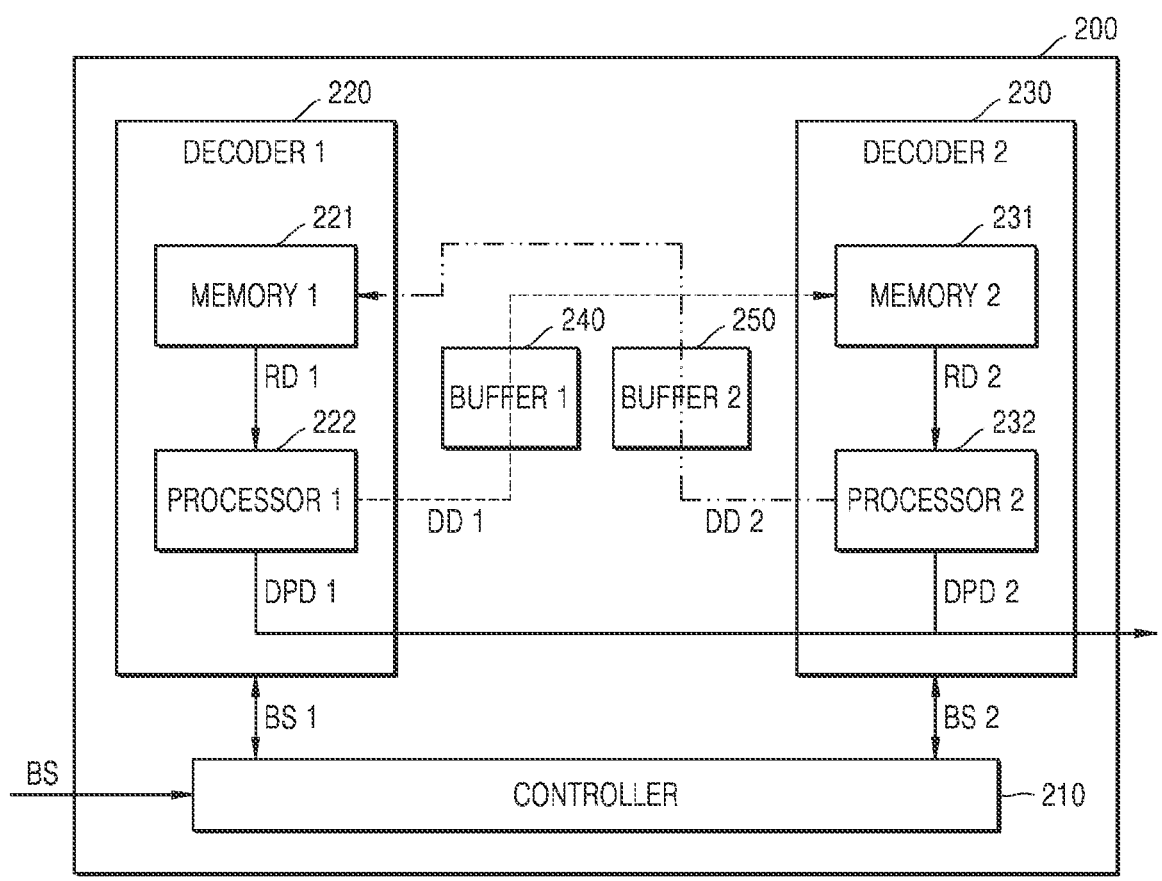
FIG. 2 is block diagram illustrating a decoding device according to an embodiment.

FIG. 2 is block diagram illustrating a decoding device according to an embodiment.

Referring to FIG. 2, a decoding device 200 may include a controller 210, a first decoder 220, a second decoder 230, a first buffer 240, and a second buffer 250. The decoding device 200 of FIG. 2 corresponds to the decoding device 122 of FIG. 1, and thus, for convenience of explanation, a duplicate description thereof is omitted.

The controller 210 may control the overall operation of the decoding device 200. The controller 210 may receive a bitstream BS. For example, the controller 210 may receive, from an encoding device (for example, the encoding device 111 of FIG. 1), encoded video data in the form of the bitstream BS.

The controller 210 may classify the bitstream BS and transmit a classified bitstream to the first decoder 220 and the second decoder 230. The controller 210 may classify the bitstream BS as a first bitstream BS 1 and a second bitstream BS 2, based on a plurality of blocks defined by a matrix and included in a frame. According to embodiments, the first decoder 220 and the second decoder 230 may have an identical configuration and structure, and may be of identical performance.

The controller 210 may transmit the first bitstream BS 1 to the first decoder 220 and transmit the second bitstream BS 2 to the second decoder 230. The first bitstream BS 1 may refer to a bitstream transmitted to the first decoder 220 from the bitstream BS, and the second bitstream BS 2 may refer to a bitstream transmitted to the second decoder 230 from the bitstream BS.

In an embodiment, the controller 210 may classify a portion of the bitstream BS corresponding to blocks included in odd-numbered rows among rows of the frame as one of the first bitstream BS 1 and the second bitstream BS 2, and classify another portion of the bitstream BS corresponding to blocks included in even-numbered rows among the rows of the frame as the other one of the first bitstream BS 1 and the second bitstream BS 2. Herein, when it is described that a process is being performed on a bitstream, it is to be understood that the process may be being performed on a portion of the received bitstream BS. Hereinafter, an operation of the decoding device 200 classifying a bitstream is described in detail with reference to FIG. 3. Hereinafter, reference is also made to FIGS. 2 and 3.

Figure 3:
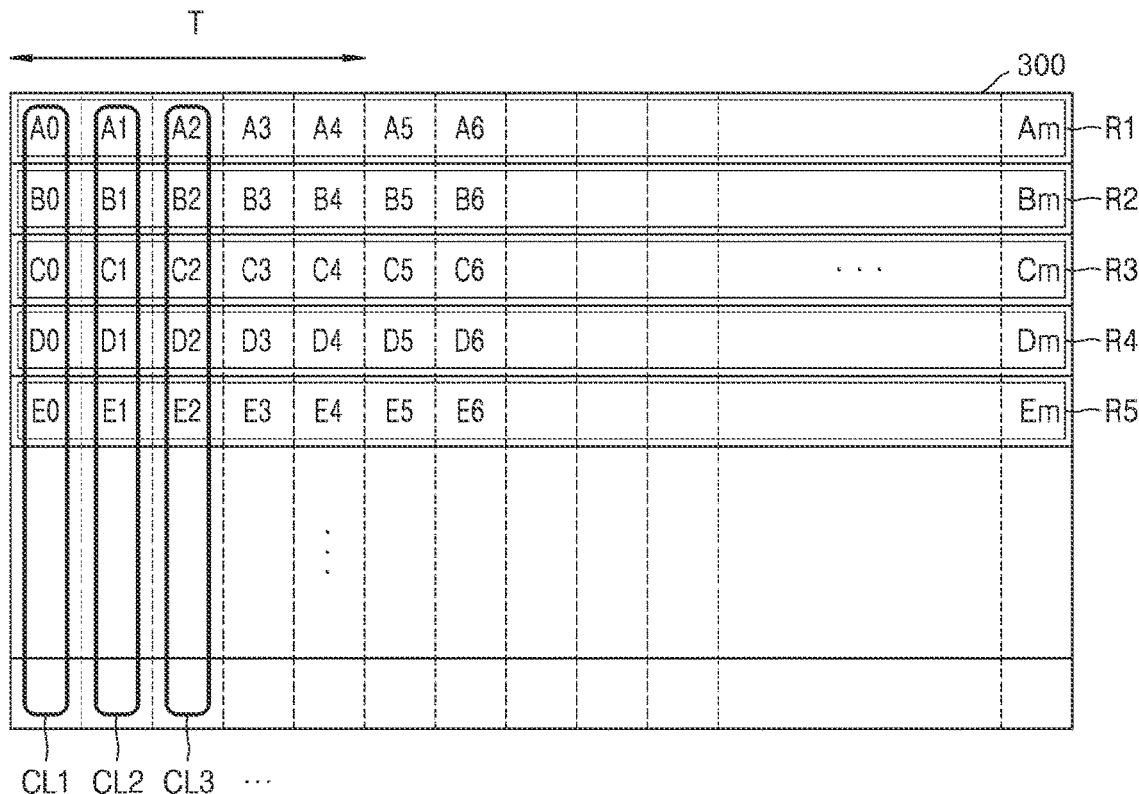
FIG. 3 is a diagram showing a frame according to an embodiment.

FIG. 3 is a diagram showing a frame according to an embodiment.

Referring to FIGS. 2 and 3, a frame 300 may include a plurality of blocks defined by a matrix. The frame 300 may be input to the controller 210 as a bitstream. The frame 300 may be a frame of an 8$k$ (7,680×4,320 pixels) image or a frame of a 4 k (3,840×2,160 pixels) image, but is not limited thereto. Although FIG. 3 shows one frame 300, a plurality of frames may be input to the controller 210 as a bitstream.

The plurality of blocks may be of the same size. For example, each of the plurality of blocks may be of a 64×64 pixel size. As another example, each of the plurality of blocks may be of a 16×16 pixel size. However, embodiments of the inventive concept are not limited thereto.

The frame 300 may be defined by a matrix, based on the plurality of blocks of the same size. The frame 300 may include a plurality of rows and a plurality of columns. Each of the plurality of rows may include a plurality of blocks. For example, a first row R1 may include a block A0, a block A1, a block A2, . . . , and a block Am, in which m is a natural number. A second row R2 may include a block B0, a block B1, a block B2, . . . , and a block Bm. A third row R3 may include a block C0, a block C1, a block C2, . . . , and a block Cm. Also, each of the plurality of columns may include a plurality of blocks. For example, a first column CL1 may include the block A0, the block B0, the block C0, etc. A second column CL2 may include the block A1, the block B1, the block C1, etc. A third column CL3 may include the block A2, the block B2, the block C2, etc.

A first row, a second row, a third row, etc. may be sequentially defined based on a row including a block on which decoding is previously performed in the same column. For example, a fourth row R4 including a block D0 in the first column CL1 may correspond to a row in which decoding is performed earlier than a fifth row R5 including a block E0. As another example, the first row R1 including the block A0 in the first column CL1 may correspond to a row in which decoding is performed earlier than the second row R2 including the block B0, and the block A0 may be decoded before the block B0.

The plurality of rows may be divided into odd-numbered rows and even-numbered rows. For example, the first row R1, the third row R3, and the fifth row R5 may correspond to odd-numbered rows, and the second row R2 and the fourth row R4 may correspond to even-numbered rows.

The controller 210 may classify a portion of the bitstream BS corresponding to blocks included in the odd-numbered rows among the rows of the frame 300 as one of the first bitstream BS 1 and the second bitstream BS 2, and classify a portion of the bitstream BS corresponding to blocks included in the even-numbered rows among the rows of the frame 300 as the other one of the first bitstream BS 1 and the second bitstream BS 2.

The controller 210 may classify, from the bitstream BS, a portion of the bitstream BS corresponding to blocks included in the odd-numbered rows and a portion of the bitstream BS corresponding to blocks included in the even-numbered rows among the rows of the frame 300 respectively as the first bitstream BS 1 and the second bitstream BS 2. For example, the controller 210 may classify the first row R1, the third row R3, and the fifth row R5 as the first bitstream BS 1, and classify the second row R2 and the fourth row R4 as the second bitstream BS 2. However, embodiments of the inventive concept are not limited thereto. For example, according to embodiments, the controller 210 may classify, from the bitstream BS, a portion of the bitstream BS corresponding to blocks included in the even-numbered rows and a portion of the bitstream BS corresponding to blocks included in the odd-numbered rows among the rows of the frame 300 respectively as the first bitstream BS 1 and the second bitstream BS 2.

A reference block may refer to a block used for decoding a block currently being decoded. The reference block may refer to a block included in a column identical to a column including the block currently being decoded and included in a row in which decoding is lastly performed among rows in which decoding is performed earlier than a row including the block currently being decoded. For example, a reference block of a block B4 may be a block A4 included in a fifth column CL5 identical to a column including the block B4 and included in a row in which decoding is performed earlier than the block B4. A reference block of a block E4 may be a block D4 included in the fifth column CL5 identical to a column including the block E4 and included in a row in which decoding is lastly performed among rows in which decoding is performed earlier than the block E4. Because blocks included in the first row R1 on which decoding is first performed are decoded first, reference blocks may not exist.

Referring to FIGS. 2 and 3, the first decoder 220 may include a first memory 221 and a first processor 222. It is assumed that the first bitstream BS 1 includes a bitstream corresponding to blocks included in the odd-numbered rows among the rows of the frame 300, and the second bitstream BS 2 includes a bitstream corresponding to blocks included in the even-numbered rows. The first processor 222 may receive the first bitstream BS 1, perform decoding on the first bitstream BS 1, and output first decoding data DD 1. The first memory 221 may store second decoding data DD 2 obtained by decoding the second bitstream BS 2. For example, the first processor 222 may perform decoding on the first bitstream BS 1 corresponding to the block A4, and output the first decoding data DD 1 corresponding to the block A4. The first memory 221 may store the second decoding data DD 2 obtained by decoding the second bitstream BS 2 corresponding to the block B0.

The second decoder 230 may include a second memory 231 and a second processor 232. The second processor 232 may receive the second bitstream BS 2, perform decoding on the second bitstream BS 2, and output the second decoding data DD 2. The second memory 231 may store the first decoding data DD 1 obtained by decoding the first bitstream BS 1.

The first decoding data DD 1 may include at least one of, for example, a motion vector, a prediction mode, and decoded first pixel data DPD 1 of the first bitstream BS 1. The second decoding data DD 2 may include at least one of, for example, a motion vector, a prediction mode, and decoded second pixel data DPD 2 of the second bitstream BS 2. The first pixel data DPD 1 and the second pixel data DPD 2 may respectively refer to data obtained by decoding the first bitstream BS 1 and image data obtained by decoding the second bitstream BS 2. The first pixel data DPD 1 and the second pixel data DPD 2 may be output to the outside of the decoding device 200. The first pixel data DPD 1 and the second pixel data DPD 2 may be transmitted to a display (for example, the display 123 of FIG. 1) and displayed to a user.

The first processor 222 may perform decoding on the first bitstream BS 1, and the second processor 232 may perform decoding on the second bitstream BS 2. For example, the first processor 222 may perform decoding on a bitstream corresponding to blocks included in the first row R1 and the third row R3, and the second processor 232 may perform decoding on a bitstream corresponding to blocks included in the second row R2 and the fourth row R4. A bitstream corresponding to blocks included in the odd-numbered rows and a bitstream corresponding to the even-numbered rows among the rows of the frame 300 may be decoded by different processors.

Each of the first processor 222 and the second processor 232 may include, for example, an application specific integrated circuit (ASIC), a field-programmable gate array (FPGA), a dedicated processor, a microprocessor, a general-purpose processor, etc.

Each of the first memory 221 and the second memory 231 may include volatile memory such as, for example, dynamic random-access memory (RAM) and synchronous dynamic RAM (SDRAM), and/or non-volatile memory such as, for example, phase-change RAM (PRAM), magneto-resistive RAM (MRAM), resistive RAM (ReRAM), ferro-electric RAM (FRAM), etc.

The decoding device 200 may include the first buffer 240 and the second buffer 250. The first buffer 240 may transmit, to the second memory 231, the first decoding data DD 1 output by the first processor 222. The first buffer 240 may store the first decoding data DD 1 and transmit the first decoding data DD 1 to the second memory 231. The first buffer 240 may store the first decoding data DD 1 based on a clock signal and transmit the first decoding data DD 1 to the second memory 231. The clock signal may be provided from a timing controller to the first buffer 240.

The second buffer 250 may transmit, to the first memory 221, the second decoding data DD 2 output by the second processor 232. The second buffer 250 may store the second decoding data DD 2 and transmit the second decoding data DD 2 to the first memory 221. The second buffer 250 may store the second decoding data DD 2 based on a clock signal and transmit the second decoding data DD 2 to the first memory 221. The clock signal may be provided from the timing controller to the second buffer 250. The clock signal provided to the first buffer 240 and the clock signal provided to the second buffer 250 may be different from each other. The decoding device 200 may store the first decoding data DD 1 in the second memory 231 through the first buffer 240 and store the second decoding data DD 2 in the first memory 221 through the second buffer 250, thereby reducing the occurrence of data path congestion.

The first buffer 240 and the second buffer 250 may each be a flip-flop. The flip-flop may include, for example, an RS flip-flop, a D flip-flop, a JK flip-flop, a T flip-flop, etc.

For example, the first buffer 240 may transmit, to the second memory 231, the first decoding data DD 1 obtained by decoding the first bitstream BS 1 corresponding to the block A4. The second buffer 250 may transmit, to the first memory 221, the second decoding data DD 2 obtained by decoding the second bitstream BS 2 corresponding to the block B0. Although FIG. 2 shows that there are one first buffer 240 and one second buffer 250, embodiments of the inventive concept are not limited thereto. For example, according to embodiments, the first buffer 240 and the second buffer 250 may be each provided in a plurality. The decoding device 200 including a plurality of first buffers 240 and second buffers 250 is described in detail with reference to FIG. 6.

The first processor 222 may control the second memory 231 to store the first decoding data DD 1. The first processor 222 may access the second memory 231 to store the first decoding data DD 1. The first processor 222 may control the second memory 231 to store the first decoding data DD 1 through the first buffer 240.

The second processor 232 may control the first memory 221 to store the second decoding data DD 2. The second processor 232 may access the first memory 221 to store the second decoding data DD 2. The second processor 232 may control the first memory 221 to store the second decoding data DD 2 through the second buffer 250.

The first processor 222 may read out the second decoding data DD 2 stored in the first memory 221. The second processor 232 may store the second decoding data DD 2 in the first memory 221, and the first processor 222 may access the first memory 221 to read out the second decoding data DD 2. The first memory 221 may be a shared memory of the first processor 222 and the second processor 232.

The second processor 232 may read out the first decoding data DD 1 stored in the second memory 231. The first processor 222 may store the first decoding data DD 1 in the second memory 231, and the second processor 232 may access the second memory 231 to read out the first decoding data DD 1. The second memory 231 may be a shared memory of the first processor 222 and the second processor 232.

The first processor 222 may read out the second decoding data DD 2 stored in the first memory 221, and decode the first bitstream BS 1 based on the second decoding data DD 2. The second processor 232 may read out the first decoding data DD 1 stored in the second memory 231, and decode the second bitstream BS 2 based on the first decoding data DD 1. For example, when the second decoding data DD 2 corresponding to the block A4 is stored in the second memory 231, the second processor 232 may decode the second bitstream BS 2 corresponding to the block B4 with reference to the second decoding data DD 2.

The first processor 222 may decode the first bitstream BS 1 corresponding to a block currently being decoded by the first processor 222, based on first reference data RD 1. The first reference data RD 1 may be, among the second decoding data DD 2, data obtained by decoding a portion of the bitstream BS corresponding to a first reference block included in a column identical to a column including the block currently being decoded by the first processor 222. The first reference block may refer to a block used for decoding a portion of the bitstream BS corresponding to the block currently being decoded by the first processor 222.

The first reference block may be included in a column identical to a column including the block currently being decoded by the first processor 222, may be included in a row in which decoding is performed by the second processor 232 earlier than a row including the block currently being decoded by the first processor 222, and may be included in a row in which decoding is lastly performed by the second processor 232 among rows in which decoding is previously performed by the second processor 232. For example, when the block currently being decoded by the first processor 222 is a block E3, a block D3, which is included in a fourth column CL4 including the block E3 and included in the fourth row R4 on which decoding is lastly performed among the second and fourth rows R2 and R4 on which decoding is performed by the second processor 232 earlier than the fifth row R5, may be a first reference block. The first processor 222 may decode the first bitstream BS 1 corresponding to the block E3 based on the first reference data RD 1 obtained by decoding a bitstream corresponding to the block D3, and output the first decoding data DD 1. The first decoding data DD 1 may be stored in the first buffer 240 and stored in the second memory 231.

When there is no reference block of a block currently being decoded by the first processor 222, the first processor 222 may decode the first bitstream BS 1 corresponding to the block currently being decoded by the first processor 222 without using the first reference data RD 1. For example, when the block currently being decoded by the first processor 222 is a block A3, there is no row in which decoding is performed by the second processor 232 earlier than the first row R1, and thus, there may be no first reference block of the block A3. The first processor 222 may decode the first bitstream BS 1 corresponding to the block A3 without using the first reference data RD 1, and output the first decoding data DD 1. The first decoding data DD 1 may be stored in the first buffer 240 and may be stored in the second memory 231.

The second processor 232 may decode the second bitstream BS 2 corresponding to a block currently being decoded by the second processor 232, based on, among the first decoding data DD 1, second reference data RD 2 obtained by decoding a portion of the bitstream BS corresponding to a second reference block included in a column identical to a column including the block currently being decoded by the second processor 232. The second reference block may refer to a block used for decoding a portion of the bitstream BS corresponding to the block currently being decoded by the second processor 232.

The second reference block may be included in a column identical to a column including the block currently being decoded by the second processor 232, may be included in a row in which decoding is performed by the first processor 222 earlier than a row including the block currently being decoded by the second processor 232, and may be included in a row in which the decoding is lastly performed by the first processor 222 among rows in which decoding is previously performed by the first processor 222. For example, when the block currently being decoded by the second processor 232 is the block D3, a block C3, which is included in the fourth column CL4 including the block D3 and included in the third row R3 on which decoding is lastly performed among the first and third rows R1 and R3 on which decoding is performed by the first processor 222 earlier than the fourth row R4, may be a first reference block. The second processor 232 may decode the second bitstream BS 2 corresponding to the block D3 based on the second reference data RD 2 obtained by decoding a bitstream corresponding to the block C3, and output the second decoding data DD 2. The second decoding data DD 2 may be stored in the second buffer 250 and stored in the first memory 221.

The controller 210 may control a time point at which the first processor 222 performs decoding and a time point at which the second processor 232 performs decoding. By the controller 210 controlling the time point at which the first processor 222 performs decoding and the time point at which the second processor 232 performs decoding, when the first processor 222 and the second processor 232 perform a decoding operation, the first reference data RD 1 and the second reference data RD 2 may be pre-stored in a memory.

A method, performed by the controller 210, of controlling a time point at which decoding is performed, is described with reference to FIG. 4.

The first decoder 220 and the second decoder 230 may have the same performance. For example, each of the first decoder 220 and the second decoder 230 may support an image of 120 frames per second (fps) at 4 k resolution. Because the decoding device 200 includes two decoders of 4 k 120 fps, the performance of the decoding device 200 may be 8 k 60 fps.

When the bitstream BS is input to the decoding device 200, the first decoder 220 and the second decoder 230 may perform decoding on different portions of the bitstream BS, respectively. For example, when a bitstream of an image of 8$k$ 60 fps is input to a TV including the decoding device 200 having 8 k 60 fps performance, the TV may decode the input bitstream to display the image. By including the decoders having the same performance, the decoding device 200 may have higher performance and may efficiently control the decoders.

Figure 4:
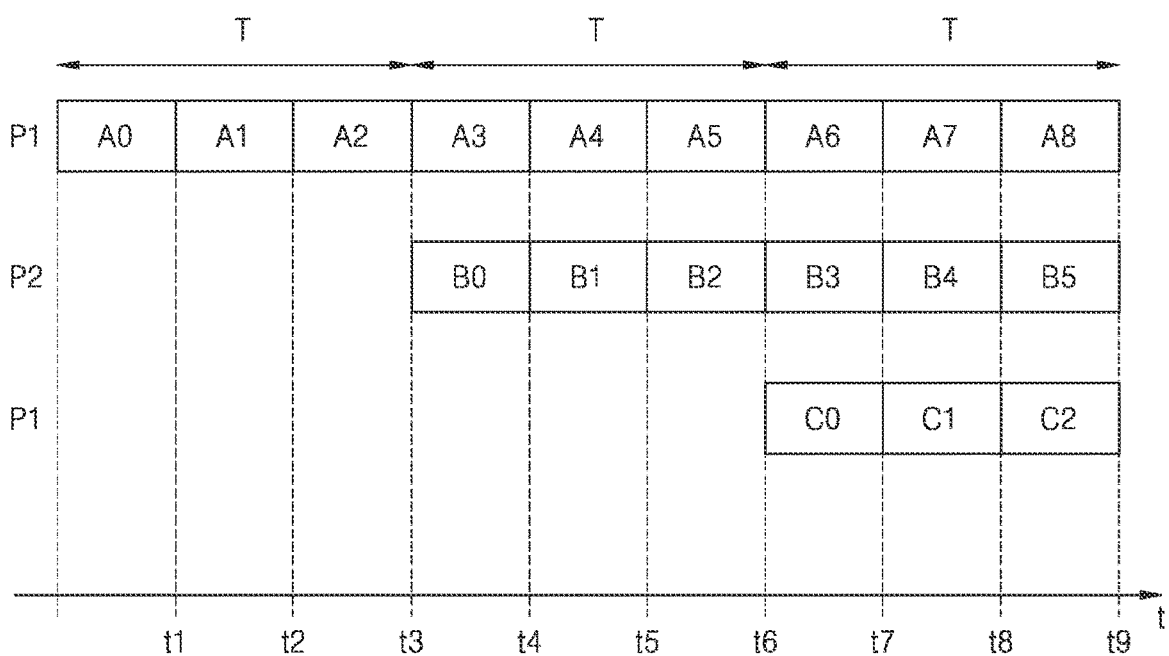
FIG. 4 is a diagram for describing an operating time point of a decoding device according to an embodiment.

FIG. 4 is a diagram for describing an operating time point of a decoding device according to an embodiment. In FIG. 4, blocks in FIG. 3 are listed according to a time when decoding is performed on a bitstream corresponding to the blocks.

Referring to FIGS. 2 and 4, the controller 210 may control a time point at which the first processor 222 performs decoding and a time point at which the second processor 232 performs decoding.

In an embodiment, the controller 210 may differently control a time point at which decoding is performed on the first bitstream BS 1 corresponding to a block currently being decoded by the first processor 222 and a time point at which the second processor 232 performs decoding on the second bitstream BS 2 corresponding to a block included in a column identical to a column including the block currently being decoded by the first processor 222. The block included in the same column may refer to a block included in the same column in a frame (for example, the frame 300 of FIG. 3).

When the block currently being decoded by the first processor 222 is the block C0, the controller 210 may control, from a sixth time point t6, the first processor 222 to perform decoding on the first bitstream BS 1 corresponding to the block C0, and control, from a third time point t3 among first through ninth time points t1 to t9, the second processor 232 to perform decoding on the second bitstream BS 2 corresponding to the block B0 included in a column including the block C0.

After the first reference data RD 1 is stored in the first memory 221, the controller 210 may control the first processor 222 to perform decoding on the first bitstream BS 1 corresponding to a block currently being decoded. After a storage completion time T from a time point at which decoding is performed on a bitstream corresponding to a first reference block, the controller 210 may control the first processor 222 to perform decoding on the first bitstream BS 1 corresponding to the block currently being decoded. The storage completion time T may refer to a sufficient time for decoding on the bitstream corresponding to the first reference block and storing the first reference data RD 1 in the first memory 221. The storage completion time T may be preset.

When the block currently being decoded by the first processor 222 is the block C0, the controller 210 may control the first processor 222 to perform decoding on the block C0 after the sixth time point t6 at which the first reference data RD 1 obtained by decoding a bitstream corresponding to a first reference block of the block C0 (for example, the block B0 in FIG. 3) is stored in the first memory 221. The first processor 222 may decode the first bitstream BS 1 corresponding to the block C0, based on the first reference data RD 1 corresponding to the block B0.

After the second reference data RD 2 is stored in the second memory 231, the controller 210 may control the second processor 232 to perform decoding on the second bitstream BS 2 corresponding to a block currently being decoded. After a storage completion time T from a time point at which decoding is performed on a bitstream corresponding to a second reference block, the controller 210 may control the second processor 232 to perform decoding on the second bitstream BS 2 corresponding to the block currently being decoded. The storage completion time T may refer to a sufficient time for decoding on the bitstream corresponding to the second reference block and storing the second reference data RD 2 in the second memory 231. The storage completion time T may be preset.

When the block currently being decoded by the second processor 232 is the block B0, the controller 210 may control the second processor 232 to perform decoding on the block B0 after the sixth time point t6 at which the second reference data RD 2 obtained by decoding a bitstream corresponding to a second reference block of the block B0 (for example, the block A0 in FIG. 3) is stored in the second memory 231. The second processor 232 may decode the second bitstream BS 2 corresponding to the block B0, based on the second reference data RD 2 corresponding to the block A0.

The storage completion time T refers to a sufficient time for storing reference data in a memory. During the storage completion time T, reference data of a block to be decoded by a processor as well as reference data of a block currently being decoded by the processor may be stored in the memory. The processor may read out reference data based on a memory address storing the reference data of the block currently being decoded. For example, when a block currently being decoded by the second processor 232 is the block B0, during a storage completion time T from the third time point t3 to the sixth time point t6, decoding data obtained by decoding bitstreams respectively corresponding to the block A0, the block A1, and the block A2 may be stored in the second memory 231. The second processor 232 may read out second reference data based on a memory address storing the second reference data RD 2 obtained by decoding a bitstream corresponding to a reference block of the block B0 (for example, the block A0 in FIG. 3) among decoding data stored in the second memory 231.

The controller 210 may receive, from each of the first processor 222 and the second processor 232, location information of a block currently being decoded by each of the first processor 222 and the second processor 232, and based on the location information, control a time point at which the first processor 222 performs decoding and a time point at which the second processor 232 performs decoding. The location information may refer to data indicating a location of a block in a frame. The block currently being decoded may refer to a block currently being decoded by a processor, or refer to a block to be subsequently decoded by the processor.

Based on location information of a block currently being decoded by the first processor 222, after the first reference data RD 1 is stored in the first memory 221, the controller 210 may control the first processor 222 to perform decoding on a first bitstream corresponding to the block currently being decoded. When the block currently being decoded by the first processor 222 is the block C1, based on location information of the block C1, after a seventh time point t7 at which the first reference data RD 1 obtained by decoding a bitstream corresponding to a reference block of the block C1 (for example, the block B1 in FIG. 3) is stored in the first memory 221, the controller 210 may control the first processor 222 to perform decoding on a bitstream corresponding to the block C1.

Based on location information of a block currently being decoded by the second processor 232, after the second reference data RD 2 is stored in the second memory 231, the controller 210 may control the second processor 232 to perform decoding on a second bitstream corresponding to the block currently being decoded.

Figure 5:
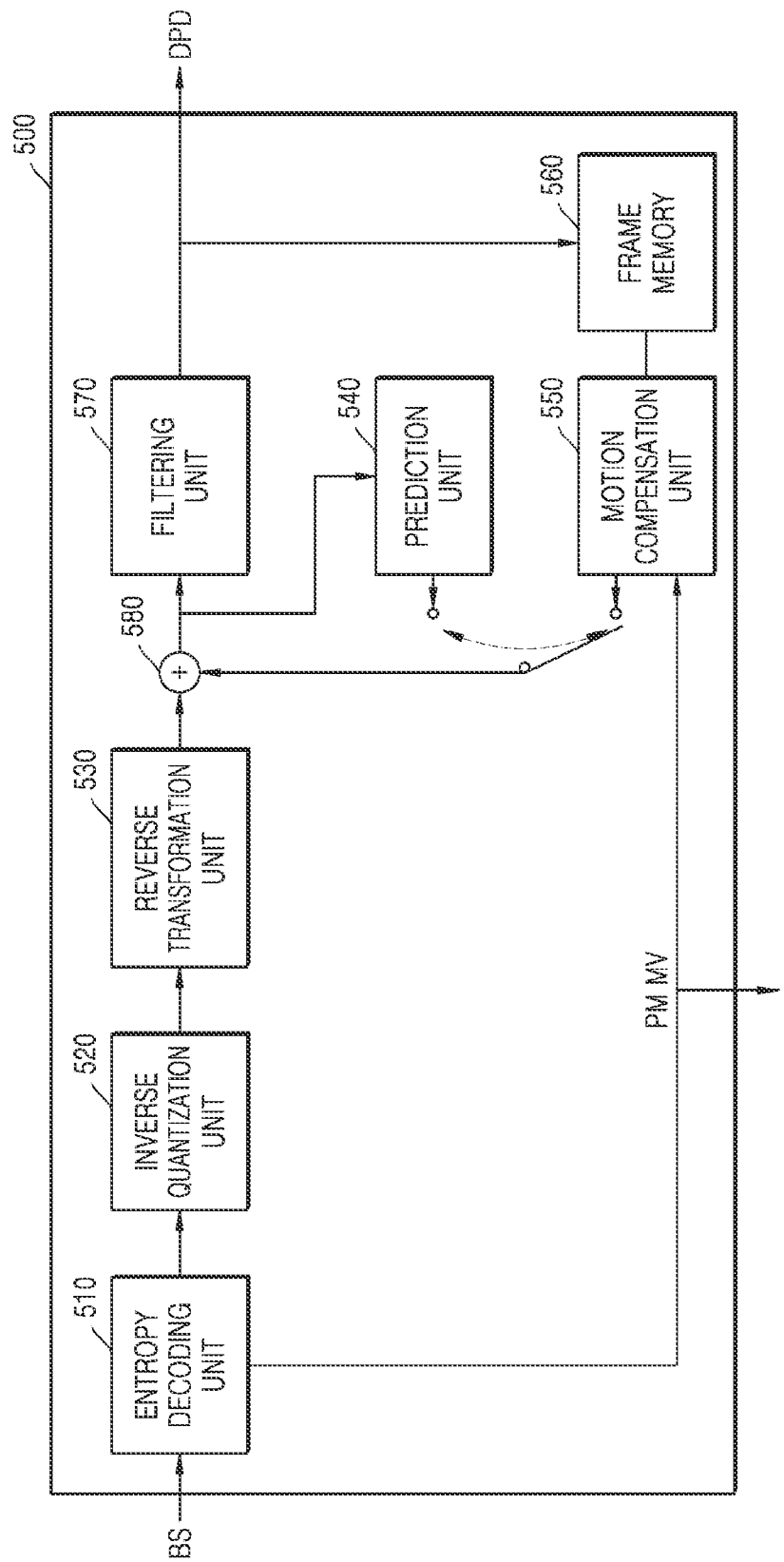
FIG. 5 is a block diagram illustrating a decoder according to an embodiment.

FIG. 5 is a block diagram illustrating a decoder according to an embodiment.

Referring to FIG. 5, a decoder 500 may include an entropy decoding unit 510, an inverse quantization unit 520, a reverse transformation unit 530, a prediction unit 540, a motion compensation unit 550, a frame memory 560, a filtering unit 570, and an adder 580. The first decoder 220 and the second decoder 230 of FIG. 2 may each be the decoder 500 of FIG. 5. The bitstream BS input to the first decoder 220 may be the first bitstream BS 1, and the bitstream BS input to the second decoder 230 may be the second bitstream BS 2. The entropy decoding unit 510, the inverse quantization unit 520, the reverse transformation unit 530, the prediction unit 540, the motion compensation unit 550, the filtering unit 570, and the adder 580 may be configured by a single hardware component (for example, a decoder or a processor) according to an embodiment.

The decoder 500 may receive a signal output from an encoding device (for example, the encoding device 111 of FIG. 1) as the bitstream BS. The bitstream BS may be decoded through the entropy decoding unit 510. The entropy decoding unit 510 may parse a bitstream to derive information utilized for decoding. The entropy decoding unit 510 may decode information in the bitstream based on a coding scheme such as, for example, exponential-Golomb coding, context-adaptive variable-length coding (CAVLC), or context-adaptive binary arithmetic coding (CABAC), and output a value of an element utilized for decoding, a motion vector MV, and quantized values of transform coefficients related to a residual.

A prediction mode PM, which is information related to prediction among information decoded by the entropy decoding unit 510, may be provided to the prediction unit 540. Quantized transform coefficients that are residual values on which entropy decoding is performed by the entropy decoding unit 510 and relevant parameter information may be input to the inverse quantization unit 520, and the motion vector MV may be provided to the motion compensation unit 550.

The inverse quantization unit 520 may perform inverse quantization on the quantized transform coefficients to output transform coefficients. The inverse quantization unit 520 may rearrange the quantized transform coefficients into a two-dimensional block. The inverse quantization unit 520 may perform inverse quantization on the quantized transform coefficients by using quantization step size information, which is a quantization parameter, and obtain the transform coefficients.

The reverse transformation unit 530 may perform reverse transformation on the transform coefficients output by the inverse quantization unit 520, and obtain a residual signal.

The prediction unit 540 may perform prediction on a block currently being decoded, and generate a predicted block for the block currently being decoded. The prediction unit 540 may determine, based on the prediction mode PM output from the entropy decoding unit 510, whether intra prediction is applied or inter prediction is applied to the block currently being decoded, and may determine an intra prediction mode and an inter prediction mode. The prediction mode PM may include information indicating a mode of intra prediction or a mode of inter prediction.

The intra prediction may predict the block currently being decoded with reference to blocks in a current frame. The referenced blocks may be located in the vicinity of the block currently being decoded or located apart from each other, according to a prediction mode. In the intra prediction, a prediction mode may include a plurality of non-directional modes and a plurality of directional modes. The prediction unit 540 may determine a prediction mode applied to the block currently being decoded, by using a prediction mode applied to neighboring blocks.

The inter prediction may induce a predicted block for the block currently being decoded, based on a reference block specified by a motion vector on a reference frame. To reduce an amount of motion information transmitted in the inter prediction mode, the motion information may be predicted in units of blocks or sub-blocks based on a correlation between neighboring blocks and the block currently being decoded. The motion information may include a motion vector and a reference frame index.

When the block currently being decoded is the intra prediction mode, the prediction unit 540 may perform intra prediction, and when the block currently being decoded is the inter prediction mode, the motion compensation unit 550 may perform a motion compensation process.

The motion compensation unit 550 may generate a prediction image by motion compensating at least one reference frame by using the motion vector MV. The reference frame may be pre-reconstructed and stored in the frame memory 560.

The adder 580 may add the residual signal provided from the reverse transformation unit 530 to a signal output from the prediction unit 540 or the motion compensation unit 550, to generate a reconstruction signal for the block currently being decoded. The reconstruction signal may be used for intra prediction of a next block in the current frame, or may be used for inter prediction of a next frame after being filtered by the filtering unit 570.

The filtering unit 570 may apply filtering to the reconstruction signal to increase image quality. The filtering unit 570 may apply a filtering scheme to the reconstruction signal to generate decoded pixel data. The filtering scheme may include, for example, deblocking filtering, a sample adaptive offset, an adaptive loop filter, and a bilateral filter. However, according to embodiments, the filtering scheme is not limited thereto.

When decoding is performed on a bitstream corresponding to the block currently being decoded, a motion vector MV, a prediction mode PM, and decoded pixel data DPD of the block currently being decoded may be generated.

Figure 6:
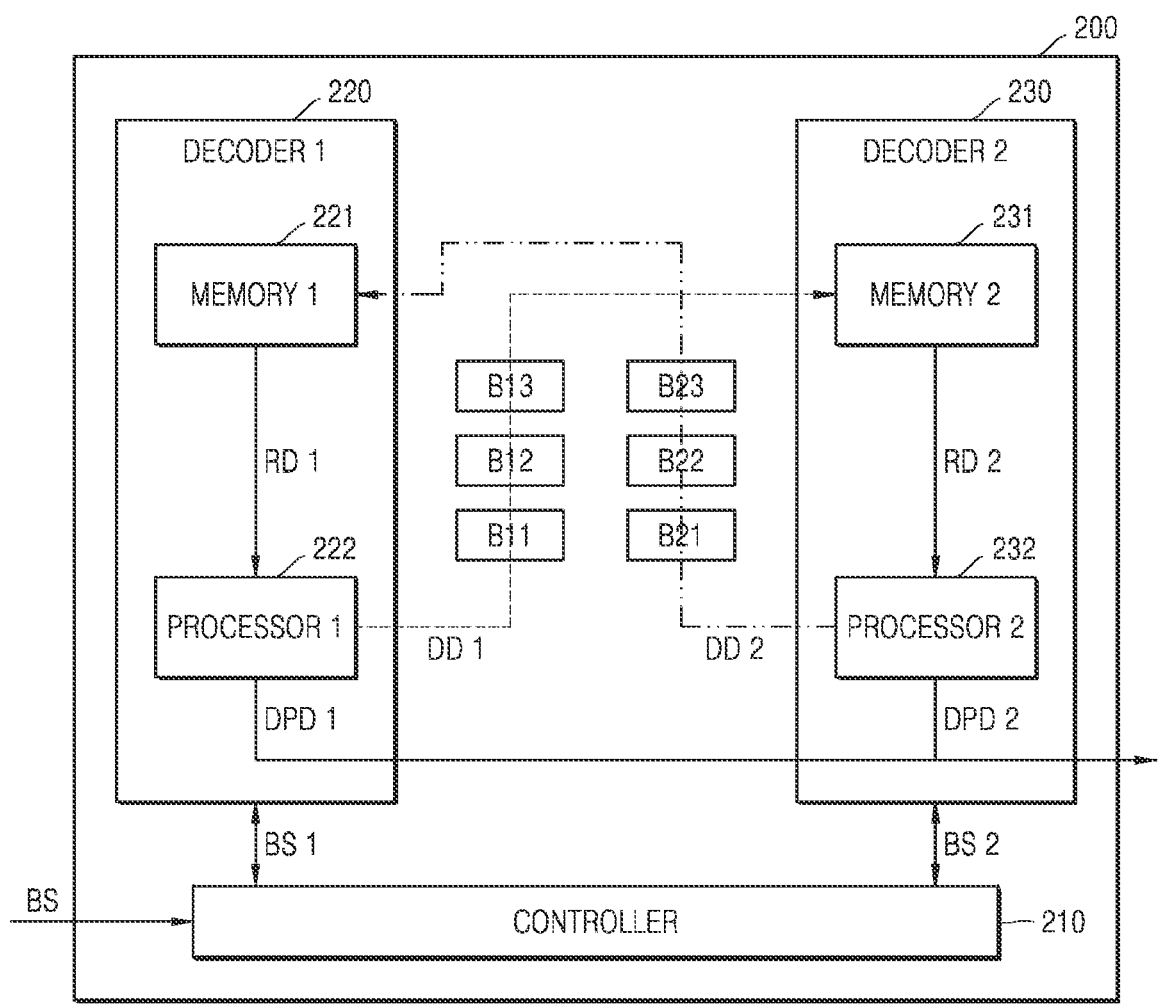
FIG. 6 is a diagram illustrating a decoding device including a plurality of buffers, according to an embodiment.

FIG. 6 is a diagram illustrating a decoding device including a plurality of buffers, according to an embodiment.

Referring to FIG. 6, the decoding device 200 may include a plurality of first buffers B11, B12, and B13 and a plurality of second buffers B21, B22, and B23. Although FIG. 6 shows three first buffers B11, B12, and B13 and three second buffers B21, B22, and B23, the numbers of first buffers and second buffers are not limited thereto. For convenience of explanation, a further description of elements and technical aspects previously described is omitted.

Each of the first buffers B11, B12, and B13 may store the first decoding data DD 1 based on a clock signal and transmit the first decoding data DD 1 to the second memory 231, and each of the second buffers B21, B22, and B23 may store the second decoding data DD 2 based on a clock signal and transmit the second decoding data DD 2 to the first memory 221. The clock signal may be provided from a timing controller to the first buffers B11, B12, and B13 and the second buffers B21, B22, and B23. The timing controller may be included inside the decoding device 200 or may be included outside the decoding device 200.

According to embodiments, the first buffers B11, B12, and B13 and the second buffers B21, B22, and B23 operate at a rising-edge of the clock signal. At a first time point (e.g., t1 in FIG. 4) of the clock signal, the first decoding data DD 1 corresponding to the block A0 decoded by the first processor 222 may be stored in the first buffer B11. At a second time point (e.g., t2 in FIG. 4), the first decoding data DD 1 corresponding to the block A0 may be stored in the first buffer B12, and the first decoding data DD 1 corresponding to the block A1 may be stored in the first buffer B11. At a third time point (e.g., t3 in FIG. 4), the first decoding data DD 1 corresponding to the block A0 may be stored in the first buffer B13, the first decoding data DD 1 corresponding to the block A1 may be stored in the first buffer B12, and the first decoding data DD 1 corresponding to the block A2 may be stored in the first buffer B11. At a fourth time point (e.g., t4 in FIG. 4), the first decoding data DD 1 corresponding to the block A3 may be stored in the first buffer B11, the first decoding data DD 1 corresponding to the block A2 may be stored in the first buffer B12, the first decoding data DD 1 corresponding to the block A1 may be stored in the first buffer B13, and the first decoding data DD 1 corresponding to the block A0 may be stored in the second memory 231.

When the first decoding data DD 1 is directly stored in the second memory 231, the first decoding data DD 1 may not be completely stored in the second memory 231 in one clock, and data path congestion may occur. The decoding device 200 according to embodiments of the inventive concept may store the first decoding data DD 1 in the second memory 231 through the first buffers B11, B12, and B13, thereby reducing the occurrence of data path congestion. The second buffers B21, B22, and B23 may operate in a similar manner to the first buffers B11, B12, and B13.

Figure 7:
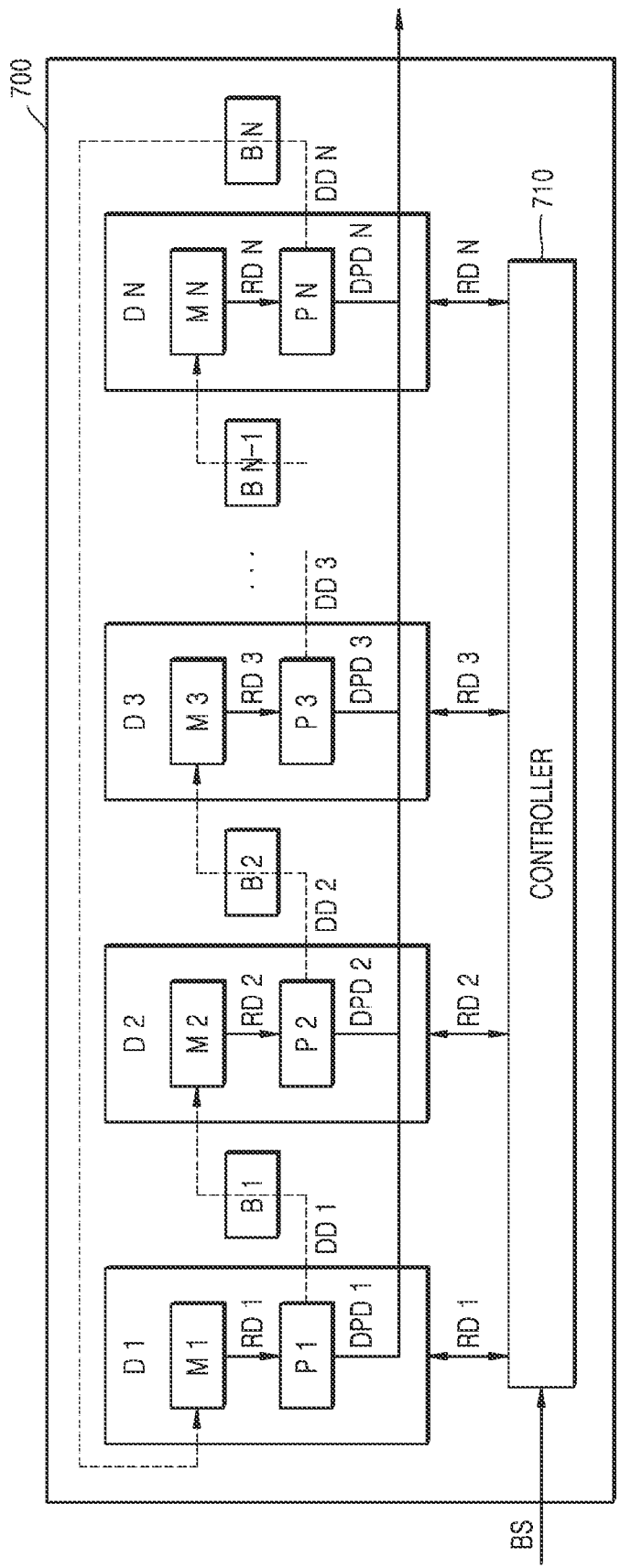
FIG. 7 is a block diagram illustrating a decoding device including a plurality of decoders, according to an embodiment.

FIG. 7 is a block diagram illustrating a decoding device including a plurality of decoders, according to an embodiment.

Referring to FIG. 7, a decoding device 700 may include a plurality of decoders. The decoding device 700 may include N decoders. Hereinafter, for convenience of explanation, a further description of elements and technical aspects previously described is omitted.

Each of the decoders may include a processor that performs decoding on a bitstream and outputs decoding data, and a memory storing the decoding data. A first decoder D 1 may include a first processor P 1 and a first memory M 1, a second decoder D 2 may include a second processor P 2 and a second memory M 2, a third decoder D 3 may include a third processor P 3 and a third memory M 3, and an Nth decoder D N may include an Nth processor P N and an Nth memory M N, where N is a natural number.

A k−1th processor included in a k−1th decoder (where k is an integer from 2 to N) may control a kth memory to store k−1th decoding data output from the k−1th decoder in the kth memory included in a kth decoder. For example, the first processor P 1 may store the first decoding data DD 1 in the second memory M 2. The second processor P 2 may store the second decoding data DD 2 in the third memory M 3. The third processor P 3 may store third decoding data DD 3 in a fourth memory. An N−1th processor may store N−1th decoding data in the Nth memory M N.

The decoding device 700 may include N buffers respectively corresponding to the N decoders. A first buffer B 1 may correspond to the first decoder D 1, a second buffer B 2 may correspond to the second decoder D 2, and an Nth buffer B N may correspond to the Nth decoder D N.

A k−1th buffer corresponding to the k−1th decoder may transmit the k−1th decoding data to the kth memory. For example, the first buffer B 1 may transmit the first decoding data DD 1 to the second memory M 2, the second buffer B 2 may transmit the second decoding data DD 2 to the third memory M 3, and an N−1th buffer B N−1 may transmit the N−1th decoding data to the Nth memory M N.

A controller 710 may classify a bitstream corresponding to blocks included in a row of a frame (for example, the frame 300 of FIG. 3) according to a row. When the decoding device 700 includes three decoders, the controller 710 may classify a bitstream corresponding to blocks included in a row numbered on plus a multiple of three as the first bitstream BS 1, classify a bitstream corresponding to blocks included in a row numbered on two plus and a multiple of three as the second bitstream BS 2, and classify a bitstream corresponding to blocks included in a row numbered a multiple of three as a third bitstream BS 3.

The k−1th processor and a kth processor may perform decoding on a portion of the bitstream BS corresponding to blocks included in different rows among rows of a frame, in the same column of the frame. For example, when the decoding device 700 includes three decoders and a frame includes 0 rows, the first decoder D 1 may perform decoding on portions of the bitstream BS corresponding to blocks included in a first row, a fourth row, and a seventh row, the second decoder D 2 may perform decoding on portions of the bitstream BS corresponding to blocks included in a second row, a fifth row, and an eighth row, and the third decoder D 3 may perform decoding on portions of the bitstream BS corresponding to blocks included in a third row, a sixth row, and a ninth row.

The Nth processor P N included in the Nth decoder D N may control the first memory M 1 to store Nth decoding data DD N output from the Nth decoder D N in the first memory M 1 included in the first decoder D 1. For example, when N is 3, the third processor P 3 may store the third decoding data DD 3 in the first memory M 1.

The Nth buffer B N corresponding to the Nth decoder D N may transmit the Nth decoding data DD N to the first memory M 1. For example, when N is 3, a third buffer B 3 may transmit the third decoding data DD 3 to the first memory M 1.

The kth processor may read out, among the k−1th decoding data, kth reference data obtained by decoding a portion of the bitstream BS corresponding to a kth reference block included in a column identical to a column including a block currently being decoded by the kth processor, and based on the kth reference data, decode a portion of the bitstream BS corresponding to the block currently being decoded by the kth processor.

The first processor P 1 may read out, among the Nth decoding data DD N, the first reference data RD 1 obtained by decoding a portion of the bitstream BS corresponding to a first reference block included in a column identical to a column including a block currently being decoded by the first processor P 1.

The first processor P 1 may decode a portion of the bitstream BS corresponding to the block currently being decoded by the first processor 222, based on the first reference data RD 1. For example, when N is 3, the second processor P 2 may read out the second reference data RD 2, and based on the second reference data RD 2, decode a portion of the bitstream BS corresponding to a block currently being decoded by the second processor P 2. The third processor P 3 may read out third reference data RD 3, and based on the third reference data RD 3, decode a portion of the bitstream BS corresponding to a block currently being decoded by the third processor P 3, and the first processor P 1 may read out the first reference data RD 1, and based on the first reference data RD 1, decode a portion of the bitstream BS corresponding to the block currently being decoded by the first processor P 1.

The controller 710 may differently control a time point at which the k−1th processor performs decoding on a portion of the bitstream BS corresponding to a block currently being decoded and a time point at which the kth processor performs decoding on a portion of the bitstream BS corresponding to a block included in a column identical to a column including the block currently being decoded by the k−1th processor. Referring to FIGS. 3 and 7, the controller 710 may differently control a time point at which the first processor P 1 performs decoding on a portion of the bitstream BS corresponding to the block A0 currently being decoded and a time point at which the second processor P 2 performs decoding on a portion of the bitstream BS corresponding to the block B0. The time point at which the second processor P 2 performs decoding on the portion of the bitstream BS corresponding to the block B0 currently being decoded and a time point at which the third processor P 3 performs decoding on a portion of the bitstream BS corresponding to the block C0 may be differently controlled.

The controller 710 may differently control a time point at which the Nth processor P N performs decoding on a bitstream corresponding to a block currently being decoded and a time point at which the first processor P 1 performs decoding on a bitstream corresponding to a k−1th reference block included in a column identical to a column including the block currently being decoded by the Nth processor P N. For example, when the decoding device 700 includes three decoders, the controller 710 may differently control the time point at which the third processor P 3 performs decoding on the bitstream corresponding to the block C0 currently being decoded and a time point at which the first processor P 1 performs decoding on a bitstream corresponding to the block A0.

Figure 8:
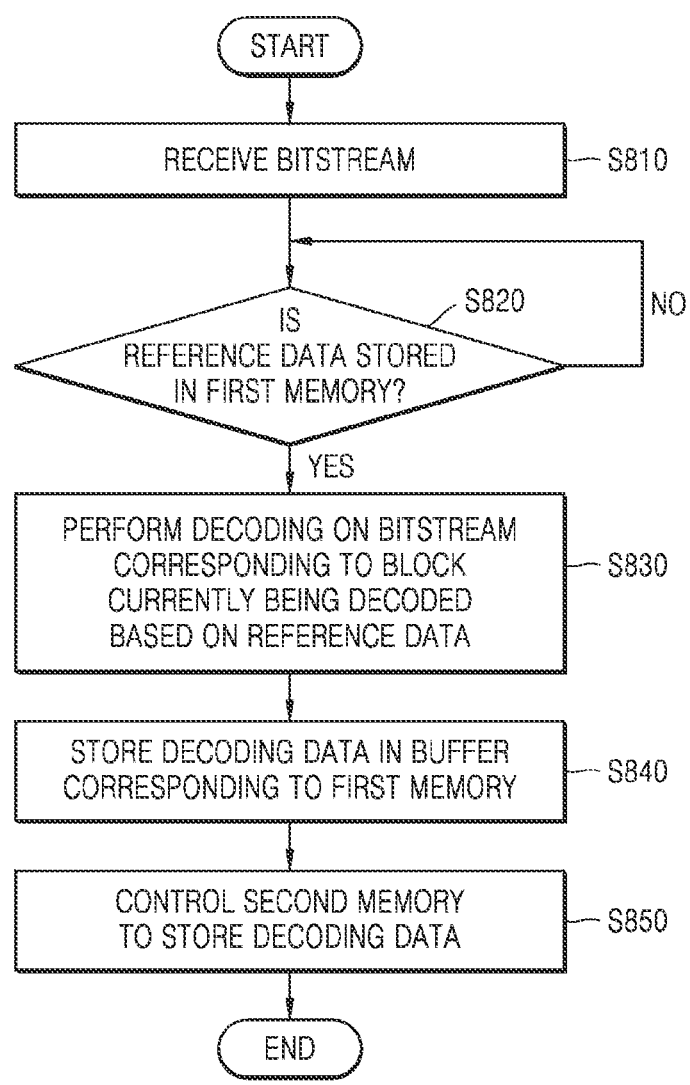
FIG. 8 is a flowchart illustrating an operating method of a decoding device, according to an embodiment.

FIG. 8 is a flowchart illustrating an operating method of a decoding device, according to an embodiment. For example, an operating method of a first decoder among a plurality of decoders included in a decoding device is described with reference to FIG. 8.

In operation S810, the first decoder receives a bitstream. The bitstream input to the first decoder may be a bitstream classified by a controller.

In operation S820, the first decoder determines whether reference data is stored in a first memory. When the reference data is stored in the first memory (operation S820, YES), the first decoder performs operation S830. When the reference data is not stored in the first memory (operation S820, NO), the first decoder performs operation S820. The first decoder may include the first memory and a first processor, and the reference data may be used by the first processor to decode a bitstream input to the first processor.

In operation S830, the first decoder performs decoding on a bitstream corresponding to a block currently being decoded, based on the reference data. The first decoder may perform decoding when the reference data is stored in the first memory based on a control signal for controlling a decoding time point of the first decoder, which is output from the controller, on the bitstream corresponding to the block currently being decoded, based on the reference data. The first decoder may perform decoding on the bitstream corresponding to the block currently being decoded, and may output decoding data.

In operation S840, the first decoder stores the decoding data in a buffer corresponding to the first memory. For example, the first decoder may store the decoding data in a first buffer corresponding to the first memory.

In operation S850, the first decoder controls a second memory to store the decoding data. By the decoding data being stored in the second memory, when a second decoder including the second memory performs a decoding operation, the decoding data may be used. Also, by the decoding data being stored in the second memory through the buffer, data path congestion may be prevented from occurring or may be reduced.

Figure 9:
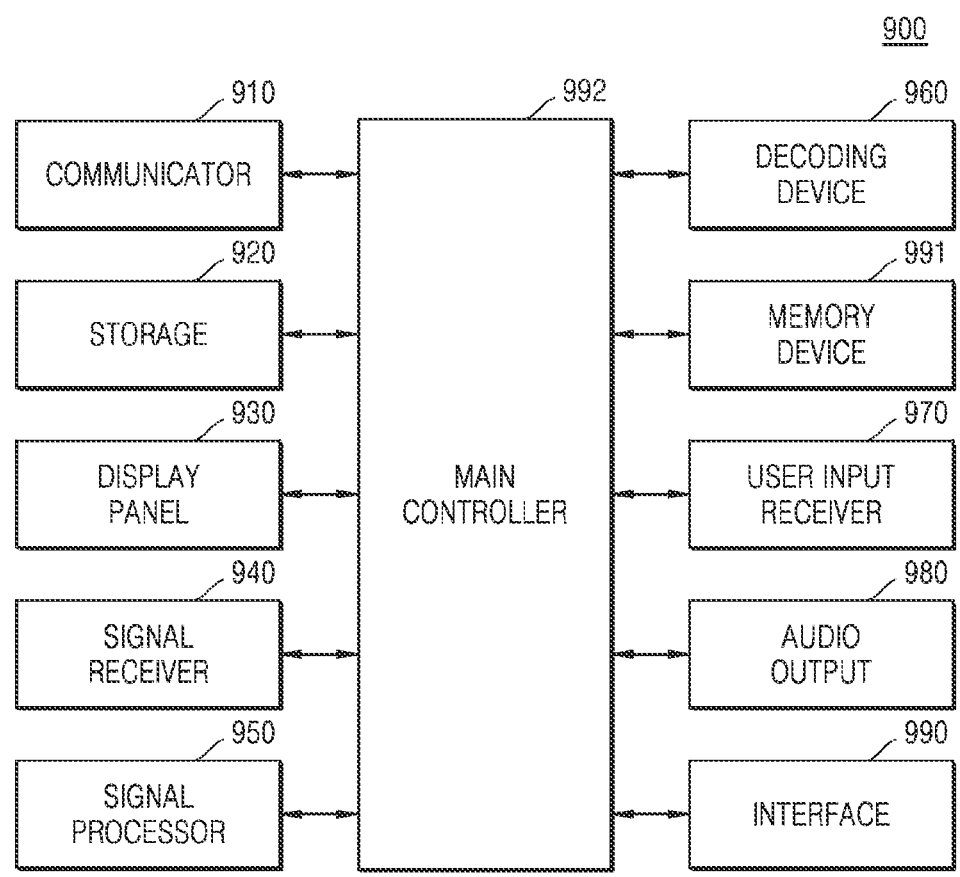
FIG. 9 is a block diagram illustrating a display device including a decoding device, according to an embodiment.

FIG. 9 is a block diagram illustrating a display device including a decoding device, according to an embodiment.

Referring to FIG. 9, a display device 900 may include a main controller 992, a communicator 910, a storage 920, a display panel 930, a signal receiver 940, a signal processor 950, a decoding device 960, a user input receiver 970, an audio output 980, an interface 990, and a memory device 991. The decoding device 200 of FIG. 2 may correspond to the decoding device 960 of FIG. 9. In an embodiment, the display device 900 may be a digital TV.

The main controller 992 may control the overall operation of the display device 900. The main controller 992 may include, for example, a central processing unit (CPU), read only memory (ROM), and random access memory (RAM) for operating the display device 900. The ROM may store an instruction set for, for example, booting a system. When a turn-on command is input to supply power, the CPU copies an operating system (OS) stored in the storage 920 to the RAM according to an instruction stored in the ROM, and executes the OS to boot the system. When booting is complete, the CPU may execute an application program copied to the RAM to perform various operations.

The communicator 910 may perform communication through a network. The communicator 910 may perform communication with various external devices connected to the network, by using a network address assigned to the display device 900.

The communicator 910 may perform network communication by using various communication methods. For example, the communicator 910 may perform network communication by using various communication methods such as wired/wireless local area network (LAN), WI-FI, wide area network (WAN), Ethernet, BLUETOOTH, ZIGBEE, Universal Serial Bus (USB), and IEEE 1394. The communicator 910 may include various communication modules for performing network communication according to each communication method. For example, when performing communication by using a wired LAN method, the communicator 910 may include a wired LAN card, and when performing communication by using a WI-FI method, may include a WI-FI communication chip. Decoded pixel data output by the decoding device 960 may be stored in the storage 920 or the memory device 991. A bitstream received from the communicator 910 may be sequentially stored in the storage 920 or the memory device 991.

The storage 920 may store data and an operating system to drive and control the display device 900. The storage 920 may store a basic program executable by the display device 900. The basic program may be an application program utilized to provide a basic function of the display device 900. The storage 920 may be implemented as a storage medium such as, for example, non-volatile memory (for example, flash memory), electrically erasable ROM (EEROM), or a hard disk.

The memory device 991 may store programs and/or data processed or executed by the main controller 992, and decoded pixel data output by the decoding device 960. The memory device 991 may be one of volatile memory devices such as, for example, DRAM, SDRAM, double data rate SDRAM (DDR SDRAM), low power DDR SDRAM (LPDDR SDRAM), graphics DDR SDRAM (GDDR SDRAM), DDR2 SDRAM, DDR3 SDRAM, DDR4 SDRAM, DDR5 SDRAM, wide input/output (I/O) DRAM, high bandwidth memory (HBM), and hybrid memory cube (HMC).

The display panel 930 may display an image based on pixel data decoded by the decoding device 960. For example, the display panel 930 may display an image based on the decoded pixel data stored in the memory device 991 or the storage 920. The display panel 930 may be implemented as, for example, an LCD, an OLED, or a plasma display panel (PDP).

The signal receiver 940 may receive broadcast content (or a broadcast signal). The broadcast content may include, for example, an image, audio, and additional data (for example, electronic programming guide (EPG)), and the signal receiver 940 may receive broadcast content from various sources such as, for example, terrestrial broadcast, cable broadcast, satellite broadcast, and Internet broadcast. For example, the signal receiver 940 may receive a video stream obtained by encoding broadcast content.

The signal processor 950 may perform signal processing on content received through the signal receiver 940. The signal processor 950 may perform signal processing, such as decoding on audio constituting content, to perform signal processing in a form that may be output from the audio output 980.

The decoding device 960 may be implemented as a single chip, or may be implemented as a device connected to the display device 900 to operate outside the display device 900. The decoding device 960 may be implemented in various forms.

The user input receiver 970 may receive inputs of various user commands. The main controller 992 may execute a function corresponding to a user command input from the user input receiver 970. For example, the user input receiver 970 may receive inputs of a user command for turning on the power of the display device 900, a user command for displaying a menu, and a user command for changing a channel and adjusting a volume.

The audio output 980 may convert an audio signal output from the signal processor 950 into a sound to output the sound through a speaker or output the sound to an external device connected through an external output terminal.

The interface 990 may connect various devices to the display device 900. The interface 990 may transmit content prestored in the display device 900 to other devices or may receive content from other devices. The interface 990 may include, for example, a high-definition multimedia interface (HDMI) input terminal, a component input terminal, a PC input terminal, or a USB input terminal.

In a comparative example, only a compression stream having a structure supporting a multi-core decoding device may be decoded in a multi-core scheme. In contrast, embodiments of the present inventive concept provide a multi-core based decoding device that decodes a video stream that may be compressed by various compression schemes as well as a video stream that may be compressed by a certain compression scheme.

As is traditional in the field of the present inventive concept, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the inventive concept has been particularly shown and described with reference to embodiments thereof, it will be understood that various changes in form and detail may be made therein without departing from the spirit and scope of the inventive concept as defined by the following claims.

What is claimed is:

1. A decoding device, comprising:
   a controller configured to receive a bitstream, classify the bitstream as a first bitstream and a second bitstream based on a plurality of blocks defined by a matrix and included in a frame, and output the first bitstream and the second bitstream;
   a first decoder including a first processor configured to perform decoding on the first bitstream and output first decoding data, and a first memory configured to store second decoding data obtained by decoding the second bitstream;
   a second decoder including a second processor configured to perform decoding on the second bitstream and output the second decoding data, and a second memory configured to store the first decoding data;
   a first buffer configured to transmit, to the second memory, the first decoding data output by the first processor; and
   a second buffer configured to transmit, to the first memory, the second decoding data output by the second processor,
   wherein the first processor is configured to control the second memory to store the first decoding data, and
   the second processor is configured to control the first memory to store the second decoding data.

2. The decoding device of claim 1, wherein the controller is configured to classify a first portion of the bitstream, which corresponds to blocks included in odd-numbered rows among rows of the frame, as one of the first bitstream and the second bitstream, and
   classify a second portion of the bitstream, which corresponds to blocks included in even-numbered rows among the rows of the frame, as the other one of the first bitstream and the second bitstream.

3. The decoding device of claim 1, wherein the first processor is configured to read out the second decoding data stored in the first memory and decode the first bitstream based on the second decoding data, and
the second processor is configured to read out the first decoding data stored in the second memory and decode the second bitstream based on the first decoding data.

4. The decoding device of claim 3, wherein the first processor is configured to decode the first bitstream, which corresponds to a block currently being decoded by the first processor, based on, among the second decoding data, first reference data obtained by decoding a portion of the bitstream corresponding to a first reference block included in a first column identical to a second column including the block currently being decoded by the first processor, and
the second processor is configured to decode the second bitstream, which corresponds to a block currently being decoded by the second processor, based on, among the first decoding data, second reference data obtained by decoding a portion of the bitstream corresponding to a second reference block included in a third column identical to a fourth column including the block currently being decoded by the second processor.

5. The decoding device of claim 4, wherein the first reference block is included in a row in which the second processor performs decoding earlier than a row including the block currently being decoded by the first processor, and
the second reference block is included in a row in which the first processor performs decoding earlier than a row including the block currently being decoded by the second processor.

6. The decoding device of claim 5, wherein the first reference block is included in a row in which the second processor lastly performs decoding, among rows in which the second processor performs decoding earlier than the row including the block currently being decoded by the first processor, and
the second reference block is included in a row in which the first processor lastly performs decoding, among rows in which the first processor performs decoding earlier than the row including the block currently being decoded by the second processor.

7. The decoding device of claim 4, wherein the first reference data is stored in the first memory, and the controller is configured to, after the first reference data is stored in the first memory, perform decoding on the first bitstream corresponding to the block currently being decoded by the first processor.

8. The decoding device of claim 4, wherein the second reference data is stored in the second memory, and the controller is configured to, after the second reference data is stored in the second memory, perform decoding on the second bitstream corresponding to the block currently being decoded by the second processor.

9. The decoding device of claim 1, wherein the controller is configured to control a time point at which the first processor performs decoding and a time point at which the second processor performs decoding.

10. The decoding device of claim 1, wherein the controller is configured to differently control a time point at which the first processor performs decoding on the first bitstream, which corresponds to a block currently being decoded, and a time point at which the second processor performs decoding on the second bitstream, which corresponds to a block included in a first column identical to a second column including the block currently being decoded by the first processor.

11. The decoding device of claim 1, wherein the controller is configured to receive, from each of the first processor and the second processor, location information of a block currently decoded by each of the first processor and the second processor, and
based on the location information, control a time point at which the first processor performs decoding and a time point at which the second processor performs decoding.

12. The decoding device of claim 1, wherein the plurality of blocks are of an equal size.

13. The decoding device of claim 1, wherein the first decoding data includes at least one of a motion vector, a prediction mode, and decoded pixel data of the first bitstream, and
the second decoding data includes at least one of a motion vector, a prediction mode, and decoded pixel data of the second bitstream.

14. The decoding device of claim 1, wherein the first buffer is configured to store the first decoding data and transmit the stored first decoding data to the second memory, and
the second buffer is configured to store the second decoding data and transmit the stored second decoding data to the first memory.

15. A decoding device, comprising:
a controller configured to receive a bitstream, and classify the bitstream as a classified bitstream corresponding to blocks included in an identical row among a plurality of blocks defined by a matrix and included in a frame;
N decoders, each including a processor configured to perform decoding on the classified bitstream by receiving the classified bitstream and output decoding data, and a memory storing the decoding data,
wherein N is a natural number greater than or equal to 3; and
N buffers each configured to transmit, to the memory, the decoding data output by the processor, and respectively corresponding to the N decoders,
wherein a k−1th processor included in a k−1th decoder is configured to control a kth memory to store k−1th decoding data output from the k−1th decoder in the kth memory included in a kth decoder, and
a k−1th buffer corresponding to the k−1th decoder is configured to transmit the k−1th decoding data to the kth memory,
wherein k is an integer greater than or equal to 2 and less than or equal to N.

16. The decoding device of claim 15, wherein the k−1th processor and a kth processor are configured to perform decoding, in an identical column of the frame, on a portion of the bitstream corresponding to blocks included in different rows among rows of the frame.

17. The decoding device of claim 16, wherein an Nth processor included in an Nth decoder is configured to control a first memory to store Nth decoding data output from the Nth decoder in the first memory included in a first decoder, and
an Nth buffer corresponding to the Nth decoder is configured to transmit the Nth decoding data to the first memory.

18. The decoding device of claim 17, wherein the kth processor is configured to read out, among the k−1th decoding data, kth reference data obtained by decoding a first portion of the bitstream corresponding to a kth reference block included in a first column identical to a second column including a block currently being decoded by the kth processor, and based on the kth reference data, decode a second portion of the bitstream corresponding to the block currently being decoded by the kth processor, and a first processor is configured to read out, among the Nth decoding data, first reference data obtained by decoding a third portion of the bitstream corresponding to a first reference block included in a third column identical to a fourth column including a block currently being decoded by the first processor, and based on the first reference data, decode a fourth portion of the bitstream corresponding to the block currently being decoded by the first processor.

19. The decoding device of claim 15, wherein the controller is configured to differently control a time point at which the k−1th processor performs decoding on a bitstream corresponding to a block currently being decoded and a time point at which a kth processor performs decoding on a bitstream corresponding to a block included in a column identical to a column including the block currently being decoded by the k−1th processor, and differently control a time point at which an Nth processor performs decoding on a bitstream corresponding to a block currently being decoded and a time point at which a first processor performs decoding on a bitstream corresponding to a k−1th reference block included in a column identical to a column including the block currently being decoded by the Nth processor.

* * * * *